United States Patent
Park

(10) Patent No.: US 7,910,154 B2
(45) Date of Patent: Mar. 22, 2011

(54) NITRIDE-BASED LIGHT EMITTING DEVICES AND METHODS OF MANUFACTURING THE SAME

(75) Inventor: Sung-soo Park, Seongnam-si (KR)

(73) Assignee: Samsung Corning Precision Materials Co., Ltd., Gyeongsanbuk-do (KR)

(*) Notice: Subject to any disclaimer, the term of this patent is extended or adjusted under 35 U.S.C. 154(b) by 1250 days.

(21) Appl. No.: 11/505,341

(22) Filed: Aug. 17, 2006

(65) Prior Publication Data

US 2007/0152353 A1 Jul. 5, 2007

(30) Foreign Application Priority Data

Jan. 5, 2006 (KR) .................... 10-2006-0001393

(51) Int. Cl.
  *B05D 5/06* (2006.01)
  *B05D 3/04* (2006.01)
  *B29D 11/00* (2006.01)
  *B31D 3/00* (2006.01)

(52) U.S. Cl. ............. 427/58; 427/335; 216/24; 216/56; 216/75

(58) Field of Classification Search ............ 427/58, 427/331, 335; 216/24, 56, 74–75
See application file for complete search history.

(56) References Cited

U.S. PATENT DOCUMENTS

| 2005/0161772 A1* | 7/2005 | Suzuki ............. 257/613 |
| 2005/0167693 A1* | 8/2005 | Goetz et al. ...... 257/103 |
| 2005/0176257 A1* | 8/2005 | Uesawa ............ 438/700 |

FOREIGN PATENT DOCUMENTS

| JP | 11-220169 | 8/1999 |
| JP | 2002-261075 | 9/2002 |

OTHER PUBLICATIONS

Office Action dated Aug. 14, 2009 for corresponding Chinese Patent Application No. 200610081818.6.

* cited by examiner

*Primary Examiner* — Timothy H Meeks
*Assistant Examiner* — James Lin
(74) *Attorney, Agent, or Firm* — Harness, Dickey & Pierce, PLC

(57) ABSTRACT

A light emitting device may include an n-clad layer formed on a crystalline wafer; a porous layer formed by processing the n-clad layer in a mixed gas atmosphere of HCl and $NH_3$. The light emitting device may further include an active layer and a p-clad layer formed on the porous layer.

16 Claims, 5 Drawing Sheets

NITRIDE-BASED LIGHT EMITTING DEVICES AND METHODS OF MANUFACTURING THE SAME

PRIORITY STATEMENT

This non-provisional U.S. patent application claims priority under 35 U.S.C. §119 to Korean Patent Application No. 10-2006-0001393, filed on Jan. 5, 2006, in the Korean Intellectual Property Office (KIPO), the entire contents of which are incorporated herein by reference.

BACKGROUND OF THE INVENTION

1. Field of the Invention

Example embodiments of the present invention relate to light emitting devices and methods for manufacturing the same. At least one example embodiment of the present invention provides a nitride-based light emitting device having increased power and/or life span and a method of manufacturing the same.

2. Description of the Conventional Art

Conventional light emitting devices, such as light emitting diodes (LED), are semiconductor PN junction diodes. PN junctions of III-V group compound semiconductor may be created by combining III-group and V-group elements from the periodic table. A III-V compound semiconductor may have a higher luminous efficiency, for example, the luminous efficiency may be close or substantially close to 100% which may be higher than silicon. Thus, LEDs may be used in, for example, diode lasers. In addition, because electrons move at higher speeds in LEDs and LEDs may operate at higher temperatures, LEDs may be used in higher-speed and/or higher-power electronic devices. For example, several III-group and V-group elements may be combined to manufacture semiconductors having a variety of material composition and/or characteristics may be manufactured.

Characteristics of LEDs may be luminosity, brightness and/or radiant flux in a visible ray region may. Luminosity may be represented by light velocity per unit cubic angle or Candelas (cd), and brightness may be indicated by luminosity per unit area. A photometer may be used to measure luminosity. Radiant flux represents power radiated from all wavelengths of an LED, and may be represented by energy radiated per unit time or Watts (W).

Luminous efficiency may be used in determining a visible ray LED performance. Luminous efficiency may be represented by Lumens per Watt (lm/W). This corresponds to wall-plug efficiency (e.g., optical output/input electric power quantity) considering the human eyes' luminosity factor. Luminous efficiency of an LED may be determined by three factors, such as internal quantum efficiency, extraction efficiency and operating voltage.

In accordance with the conventional art, LEDs may have a sapphire/n-GaN/MQW/p-GaN structure. However, in such LEDs, defect density may be higher due to manufacturing limitations. Thus, internal quantum efficiency of an MQW layer and/or manufacturing higher-power LEDs may be limited. In higher-power LEDs, due to the defects, a leakage current may be larger, which may increase a driving voltage of a device and/or reduce the life span of the device.

An example, conventional LED may have a nano rod array structure with an InGaN quantum well. In this example, a method of manufacturing the nano rod may be more complicated and/or it may be difficult to actually utilize such a technology in industry.

SUMMARY OF THE INVENTION

Example embodiments of the present invention provide nitride-based light emitting devices having higher power and/or longer life span and methods of manufacturing the same.

According to an example embodiment of the present invention, a light emitting device (LED) may include an n-clad layer formed on a crystalline wafer. A porous layer may be formed by processing the n-clad layer (e.g., from its top surface to a depth) in a mixed gas atmosphere of HCl and $NH_3$. An active layer and a p-clad layer may be formed (e.g., sequentially) on the porous layer. The porous layer may be formed to a thickness of about 1 µm to about 10 µm, inclusive.

In at least some example embodiments of the present invention, the crystalline wafer may be a Si, GaAs, SiC, GaN or sapphire substrate. The n-clad layer may be an n-GaN layer and the p-clad layer may be a p-GaN layer. The active layer may have a multi-quantum well (MQW) structure such as a GaN/InGaN/GaN MQW or GaN/AlGaN/GaN MQW structure.

According to another example embodiment of the present invention, a method of manufacturing a light emitting device may include forming an n-clad layer on a crystalline wafer. The n-clad layer may be processed (e.g., from its top surface to a depth) in a mixed gas atmosphere of HCl and $NH_3$ to form a porous layer. An active layer and a p-clad layer may be formed (e.g., sequentially) on the porous layer.

The surface processing may be performed at a temperature of about 950° C. to about 1200° C., inclusive. For example, surface processing may be performed at a temperature of about 1065° C. The surface processing may be performed in a halide or hydride vapor phase epitaxy (HVPE) system. In this example, a mixture ratio of HCl and $NH_3$ may be about 1:10. The mixed gas may further include a carrier gas including an inert gas, for example, at least one of $N_2$, Ar and $H_2$. In this example, a mixture ratio of HCl, $NH_3$ and the carrier gas may be about 1:10:80. The n-clad layer, the active layer and/or the p-clad layer may be formed using vapor deposition. The vapor deposition may be one of halide or hydride vapor phase epitaxy (HVPE), metal organic chemical vapor deposition (MOCVD) or molecular beam epitaxy (MBE).

BRIEF DESCRIPTION OF THE DRAWINGS

The present invention will become more apparent by describing in detail some example embodiments with reference to the attached drawings in which.

DETAILED DESCRIPTION OF EXAMPLE EMBODIMENTS OF THE PRESENT INVENTION

Figure 1:
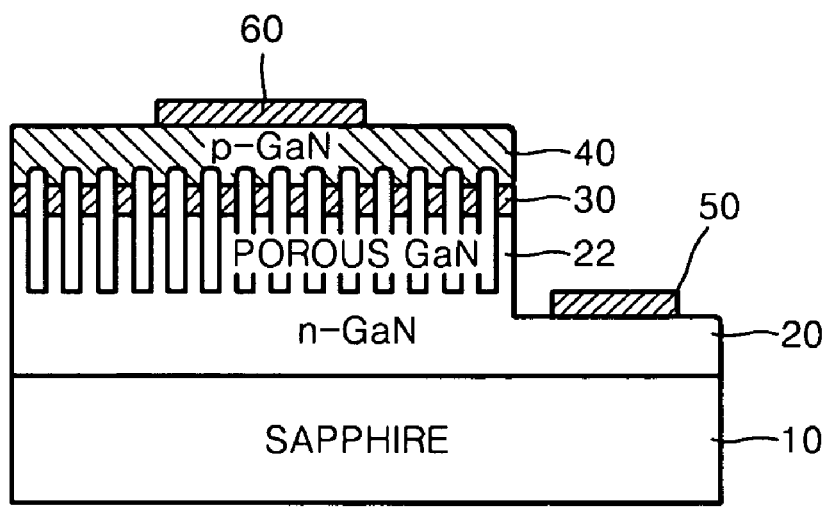
FIG. 1 is a schematic cross-sectional view of a light emitting device according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a schematic cross-sectional view of a light emitting device according to an example embodiment of the present invention. As shown, the light emitting device may include an n-clad layer 20, a porous layer 22, an active layer 30 and/or a p-clad layer 40. The n-clad layer 20, the porous layer 22, the n active layer 30 and/or the p-clad layer 40 may be formed (e.g., sequentially) on a crystalline wafer 10. An n-electrode 50 and a p-electrode 60 may be formed on an etched surface of the n-clad layer 20 and on the p-clad layer 40, respectively. The single crystalline wafer 10 may be, for example, a Si, GaAs, SiC, GaN, sapphire or any other suitable substrate. The n-clad layer 20 may be formed of a nitride semiconductor layer, for example, an n-GaN-based III-V-group nitride semiconductor layer (e.g., an n-GaN layer, an n-GaN/AlGaN layer, etc.). The p-clad layer 40 may be formed of a nitride semiconductor layer, for example, a p-GaN-based III-V-group nitride semiconductor layer (e.g., a p-GaN layer, a p-GaN/AlGaN layer, etc.). Because the structure and material of the n-clad layer 20 and the p-clad layer 40 and a method of forming the same are well-known in the art, a detailed description will be omitted for the sake of brevity.

The n-clad layer 20 may be processed from a top surface to a desired or given depth in a mixed gas atmosphere of, for example, HCl and $NH_3$ to form the porous layer 22. The porous layer 22 may be formed of, for example, a plurality of protrusion pillars. When the porous layer 22 is formed to a thickness of about 1 μm to about 10 μm, inclusive, an optical power characteristic of the light emitting device may be improved. A method of forming the porous layer 22, according to an example embodiment of the present invention, will be described in detail with regard to FIGS. 2A-2G.

The active layer 30 may be formed of a nitride semiconductor layer, for example, a GaN-based III-V-group nitride semiconductor layer. In at least one example embodiment of the present invention, the active layer 30 may be formed of $In_xAl_yGa_{1-x-y}N$ ($0 \leq x < 1$, $0 \leq y < 1$ and $0 \leq x+y < 1$), for example, an InGaN layer, an AlGaN layer or any other similar layer. In at least this example embodiment, the active layer 30 may have a multi-quantum well (MQW) or a single quantum well (SQW) structure. For example, the active layer 30 may have a GaN/InGaN/GaN MQW, a GaN/AlGaN/GaN MQW or any other similar structure.

In a light emitting device having the above structure, if a voltage is applied between the n-electrode 50 and the p-electrode 60, electrons and holes may be injected into the active layer 30 from the n-clad layer 20 and the p-clad layer 40, respectively, and combined in the active layer 30 so that light may be output from the active layer 30.

According to at least some example embodiments of the present invention, the surface of the n-GaN layer 20 may be processed to a desired or given thickness to form the porous layer 22. Defects such as edge dislocation, included in the n-GaN layer 20, may be removed while performing this processing, and an MQW layer having a lower defect density may be formed on the porous layer 22. This may result in a light emitting device having improved electrical characteristics, reduced leakage current and/or improved internal quantum efficiency.

According to at least the above described example embodiment, the active layer 30 may be formed of a plurality of areas (e.g., dots) which may be formed on each of the protrusion pillars of the porous layer 22. The areas may be aligned in a line. However, according to another example embodiment of the present invention, the areas (e.g., dots) may be connected to one another, for example, continuously. For example, when forming the active layer 30, a relative size of a vertical growth $G_V$ velocity and/or a lateral growth $G_L$ velocity may be adjusted to control the shape of the active layer 30. The active layer 30 may be formed into various shapes.

Figure 2A:
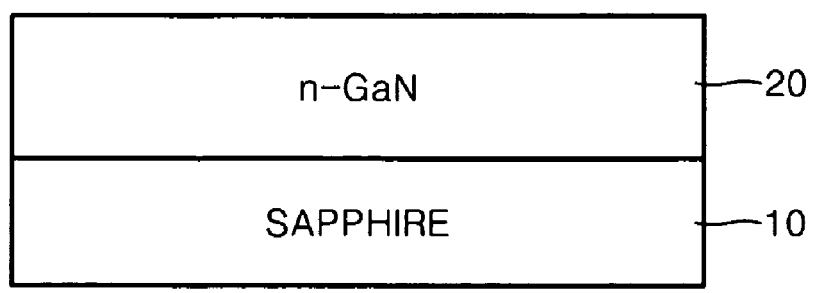
FIGS. 2A through 2G are flowcharts illustrating a method of manufacturing a light emitting device according to an example embodiment of the present invention.

FIGS. 2A through 2G are flowcharts illustrating a method of manufacturing a light emitting device according to an example embodiment of the present invention. Referring to FIG. 2A, the n-clad layer 20 may be formed on the crystalline wafer 10. The clad layer 20 may be formed using the same or substantially the same stacking method, for example, a GaN-based crystalline layer growth on a GaN substrate, a GaN-based crystalline growth on a sapphire substrate or any other suitable stacking method. The n-clad layer 20 may be formed of a nitride semiconductor layer (e.g., an n-GaN-based III-V-group nitride semiconductor layer, such as, an n-GaN layer, an n-GaN/AlGaN layer, etc.). The n-clad layer 20 may be formed using, for example, vapor deposition, such as, halide or hydride vapor phase epitaxy (HVPE), metal organic chemical vapor deposition (MOCVD), molecular beam epitaxy (MBE) or any other suitable deposition technique. Because the methods are well-known in the art, a detailed description will be omitted for the sake of brevity.

Figure 2B:
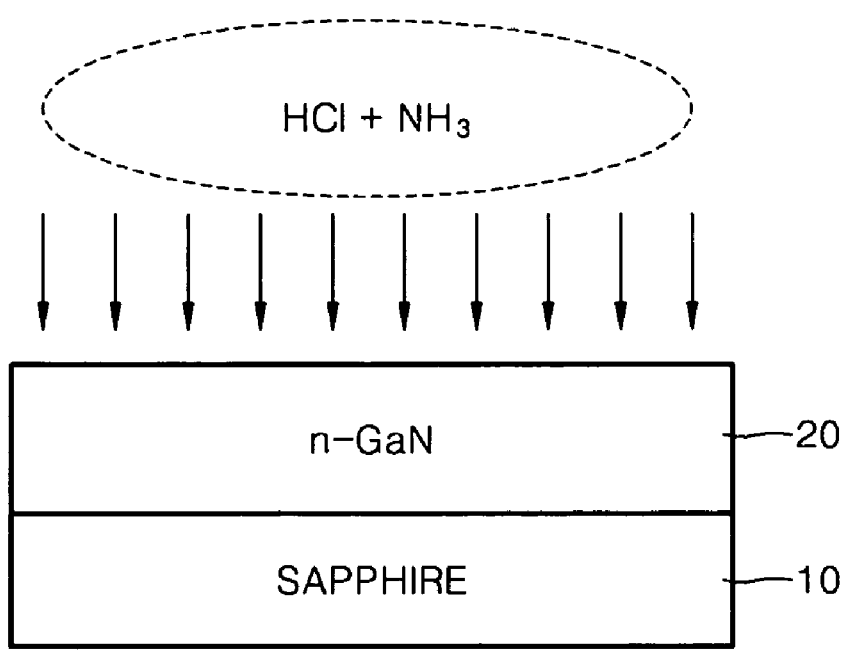
Figure 2C:
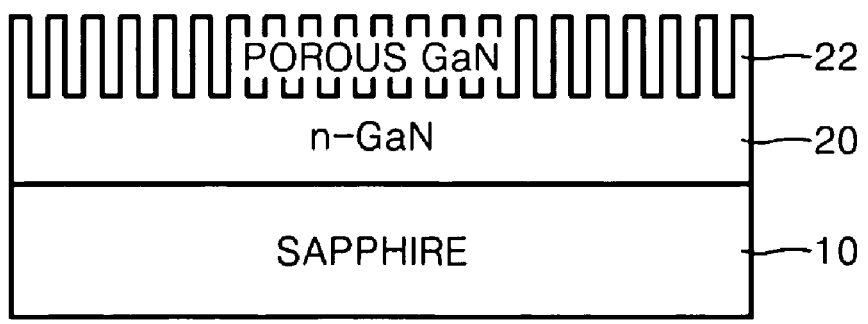

Referring to FIGS. 2B and 2C, the n-clad layer 20 may be processed from a top surface to a given or desired depth in a mixed gas atmosphere of HCl and $NH_3$ to form the porous layer 22. In this example, the porous layer 22 may be formed of a plurality of protrusion pillars, and/or to a thickness of about 1 μm to about 10 μm, inclusive. A mixture ratio of HCl and $NH_3$ may be about 1:10, and the mixed gas may further include a carrier gas. The carrier gas may include at least one of $N_2$, Ar, $H_2$, or any other similar inert gas. A mixture ratio of HCl, $NH_3$ and the carrier gas may be about 1:10:80. The surface processing may be performed at a temperature of about 950° C. to about 1200° C., inclusive, for example, about 1065° C. The surface processing may be performed in a reaction chamber, for example, an HVPE system.

While the process of forming the porous layer 22 is performed, defects such as edge dislocation, included in the n-GaN layer 20 may be removed. The mixed gas atmosphere of HCl and $NH_3$ may act as a vapor etchant. Defect regions in the n-GaN layer 20 may be etched and changed into a porous shape.

Figure 2D:
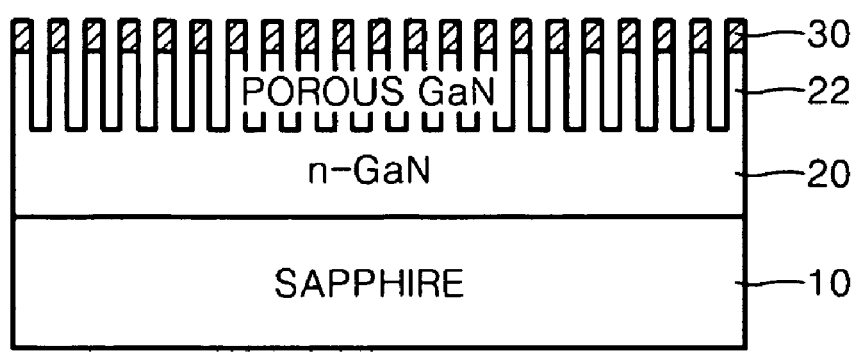
Figure 2E:
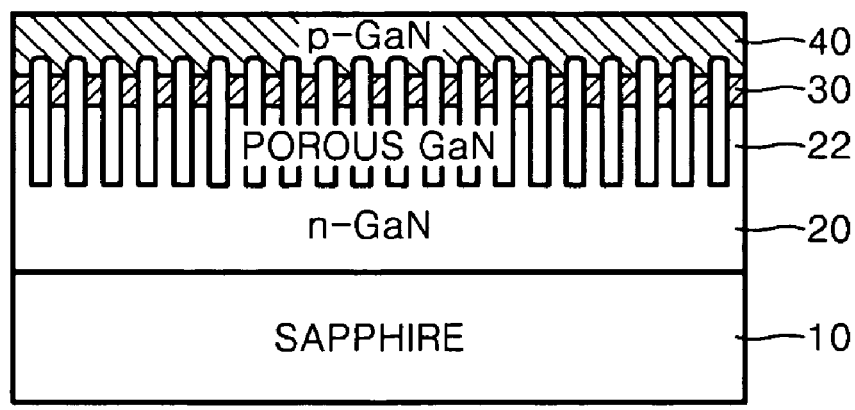

Referring to FIGS. 2D and 2E, the active layer 30 and the p-clad layer 40 may be formed (e.g., sequentially) on the porous layer 22. The active layer 30 and the p-clad layer 40 may be formed using vapor deposition, such as, HVPE, MOCVD, MBE, etc.

The active layer 30 may be formed of a nitride semiconductor layer, for example, a GaN-based III-V-group nitride semiconductor layer, such as, $In_xAl_yGa_{1-x-y}N$ ($0 \leq x < 1$, $0 \leq y < 1$ and $0 \leq x+y < 1$) (e.g., an InGaN layer, an AlGaN layer, etc.). In this example, the active layer 30 may have a multi-quantum well (MQW) or a single quantum well (SQW) structure. For example, the active layer 30 may be formed of GaN/InGaN/GaN MQW or GaN/AlGaN/GaN MQW.

According to this example embodiment of the present invention, the active layer 30 may be formed of a plurality of areas (e.g., dots) which may be formed on each of the protrusion pillars of the porous layer 22 and aligned in a line. However, according to at least some other example embodiments of the present invention, the areas may also be connected to one another continuously. For example, when the forming the active layer 30, a relative size of a vertical growth $G_v$ velocity and a lateral growth $G_L$ velocity may be adjusted to control the shape of the active layer 30. In this example, velocity of $G_v$ and/or $G_L$ may be controlled by adjusting a relative composition ratio of a source material, such as, a GaN-based III-V-group source material. In at least some example embodiments of the present invention, a relative composition ratio of Trimethylgallium (TMGa) and $NH_3$ may be controlled. Because this is well-known in the art, a detailed description will be omitted for the sake of brevity.

The p-clad layer 40 may be formed of a nitride semiconductor layer, for example, a p-GaN-based III-V-group nitride semiconductor layer, such as, a p-GaN layer or a p-GaN/AlGaN layer. Similarly, velocity of $G_v$ and $G_L$ of the p-clad layer 40 may be controlled so that the p-clad layer 40 may be connected to the active layer 30, for example, continuously.

Figure 2F:
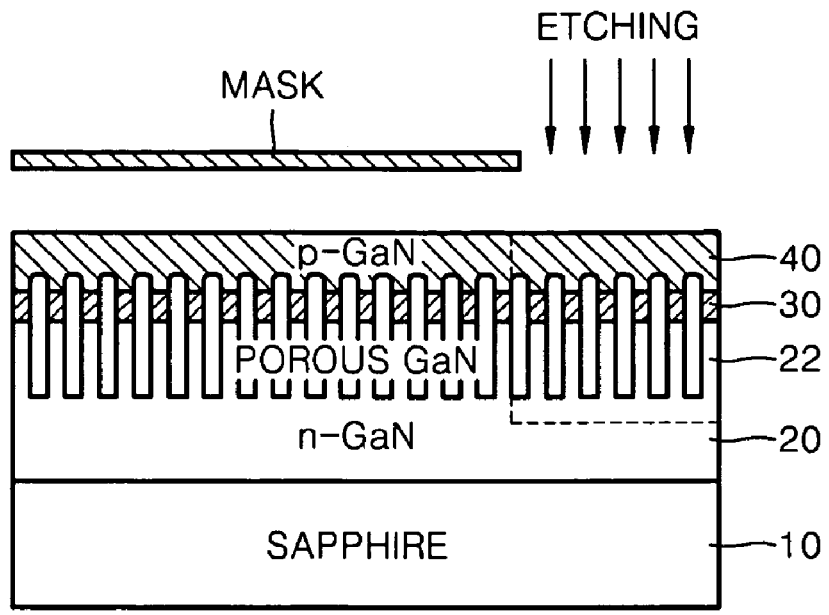
Figure 2G:
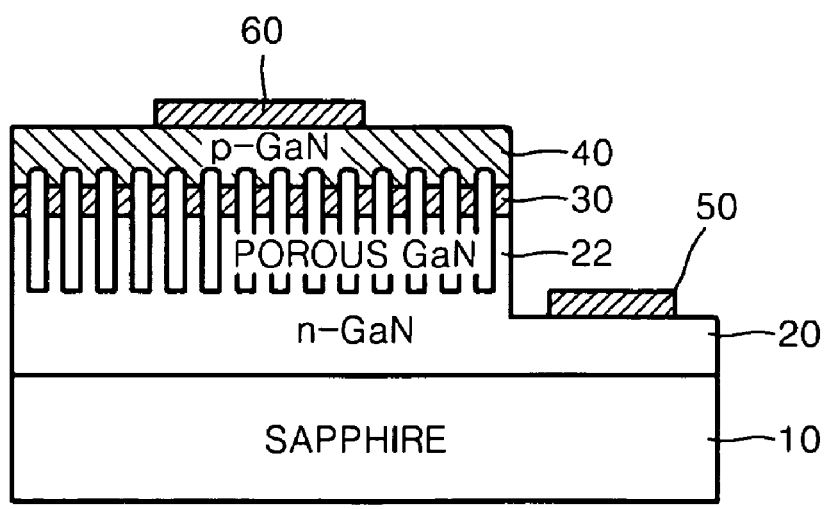

Referring to FIGS. 2F and 2G, a top surface of the p-clad layer 40 may be etched to a desired or given depth of the n-clad layer 20 to form an etched surface on the n-clad layer 20. The n-electrode 50 and the p-electrode 60 may be formed on the etched surface of the n-clad layer 20 and the p-clad layer 40. The n-electrode 50 and the p-electrode 60 may be formed of a conductive material, such as Ag, Au, indium tin oxide (ITO), etc. to produce a light emitting device, according to at least some example embodiments of the present invention.

Figure 3:
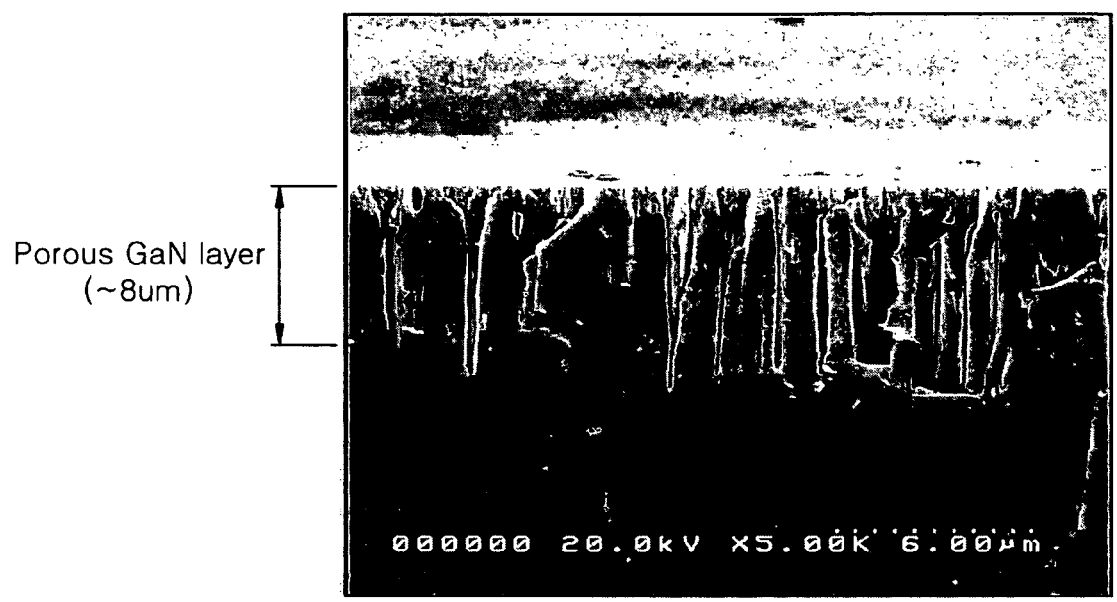
FIG. 3 is a sectional scanning electron microscope (SEM) photo showing a porous GaN layer manufactured according to an example embodiment of the present invention.

Experimental results of an example embodiment of the present invention will now be described. To form a porous GaN layer used in the experiment, a GaN substrate was mounted in an HVPE system, and the temperature of the system was raised to 1065° C. 100 sccm of HCl gas, 1000 sccm of $NH_3$ gas, and 8000 sccm of $N_2$ gas were injected into the HVPE system. Pressure of the HVPE system was adjusted to a normal pressure, and the porous GaN layer was formed. A thickness of the porous GaN layer or an air gap in the porous GaN layer was controlled by adjusting process parameters such as temperature, gas flux and process time. The stack structure was placed in an MOCVD chamber and an MQW layer and a p-GaN layer were formed on the porous GaN layer. After forming the MQW layer, a vertical growth $G_v$ velocity was higher than a lateral growth $G_L$ velocity, and when the p-GaN layer was grown, the lateral growth $G_L$ velocity was higher than the vertical growth $G_v$ velocity so that p-GaN layers were connected and adhered to each other. The n-electrode and the p-electrode were then formed as described above. FIG. 3 is a sectional scanning electron microscope (SEM) photo showing a porous GaN layer manufactured in an experimental example as described above.

At least some example embodiments of the present invention provide a light emitting device having increased power and/or life span. A given or desired thickness of the n-clad layer, for example, the surface of the n-GaN layer may be processed to a given or desired thickness forming the porous layer. While the process is performed, defects included in the n-GaN layer may be removed, and the MQW layer may have a lower defect density so that the nitride-based light emitting device may have improved electrical characteristics, reduced leakage current and/or improved internal quantum efficiency. As a result, the production yield of the light emitting device may be improved, and/or the light emitting device, according to at least some example embodiments of the present invention, may be manufactured more simply, easier and/or manufacturing costs may be reduced. Thus, according to at least some example embodiments of the present invention, a higher-quality light emitting device may be manufactured with lower costs.

While example embodiments of the present invention have been discussed herein with regard to particular III-group and V-group elements, any suitable III-group or V-group (e.g., III-nitride semiconductors, etc.) may be used.

While the present invention have been particularly shown and described with reference to example embodiments thereof, it will be understood by those skilled in the art that various changes in form and details may be made therein without departing from the spirit and scope of the invention as defined by the following claims.

What is claimed is:

1. A method of manufacturing a light emitting device, the method comprising:
   forming an n-clad layer on a crystalline wafer;
   forming a porous layer by processing the n-clad layer in a gas atmosphere of HCl and $NH_3$ after the forming the n-clad layer; and sequentially forming an active layer and a p-clad layer on the porous layer.

2. The method of claim 1, wherein processing the n-clad layer is performed at a temperature of about 950° C. to about 1200° C., inclusive.

3. The method of claim 2, wherein processing the n-clad layer is performed at a temperature of about 1065° C.

4. The method of claim 1, wherein processing the n-clad layer is performed in a halide or hydride vapor phase epitaxy (HVPE) system.

5. The method of claim 1, wherein a mixture ratio of HCl and $NH_3$ is about 1:10.

6. The method of claim 1, wherein the gas further includes a carrier gas.

7. The method of claim 6, wherein the carrier gas includes at least one of $N_2$, Ar and $H_2$.

8. The method of claim 6, wherein a mixture ratio of HCl, $NH_3$ and the carrier gas is about 1:10:80.

9. The method of claim 1, wherein the porous layer is formed to a thickness of about 1 μm to about 10 μm inclusive.

10. The method of claim 1, wherein the crystalline wafer is a Si, GaAs, SiC, GaN or sapphire substrate.

11. The method of claim 1, wherein the n-clad layer is an n-GaN layer and the p-clad layer is a p-GaN layer.

12. The method of claim 1, wherein the active layer has a multi-quantum well (MQW) structure.

13. The method of claim 12, wherein the active layer has a GaN/InGaN/GaN MQW or GaN/AlGaN/GaN MQW structure.

14. The method of claim 1, wherein the n-clad layer, the active layer and the p-clad layer are formed using vapor deposition.

15. The method of claim 14, wherein the vapor deposition is one of halide or hydride vapor phase epitaxy (HVPE), metal organic chemical vapor deposition (MOCVD) or molecular beam epitaxy (MBE).

16. A method of manufacturing a light emitting device, the method comprising:
 forming an n-clad layer on a crystalline wafer;
 forming a porous layer including a plurality of pillars by processing the n-clad layer in a gas atmosphere of HCl and $NH_3$ after the forming the n-clad layer;
 forming an active layer of dots on the pillars, the dots each separated from each other; and
 forming a p-clad layer on the active layer.

* * * * *